US009379212B1

(12) United States Patent
Zhang et al.

(10) Patent No.: US 9,379,212 B1
(45) Date of Patent: Jun. 28, 2016

(54) EXTENDED-DRAIN TRANSISTOR USING INNER SPACER

(71) Applicant: BROADCOM CORPORATION, Irvine, CA (US)

(72) Inventors: Qintao Zhang, Tustin, CA (US); Shom Surendran Ponoth, Irvine, CA (US); Akira Ito, Irvine, CA (US)

(73) Assignee: BROADCOM CORPORATION, Irvine, CA (US)

( * ) Notice: Subject to any disclaimer, the term of this patent is extended or adjusted under 35 U.S.C. 154(b) by 0 days.

(21) Appl. No.: 14/611,134

(22) Filed: Jan. 30, 2015

Related U.S. Application Data

(60) Provisional application No. 62/098,293, filed on Dec. 30, 2014.

(51) Int. Cl.
| H01L 29/78 | (2006.01) |
| H01L 29/66 | (2006.01) |
| H01L 21/02 | (2006.01) |
| H01L 29/423 | (2006.01) |
| H01L 23/66 | (2006.01) |

(52) U.S. Cl.
CPC ...... *H01L 29/66553* (2013.01); *H01L 21/0217* (2013.01); *H01L 21/02164* (2013.01); *H01L 21/02167* (2013.01); *H01L 23/66* (2013.01); *H01L 29/42364* (2013.01); *H01L 29/66492* (2013.01); *H01L 29/66575* (2013.01); *H01L 29/66659* (2013.01); *H01L 29/7835* (2013.01)

(58) Field of Classification Search
USPC .......................................... 257/327
See application file for complete search history.

(56) References Cited

U.S. PATENT DOCUMENTS

| 9,117,905 | B2 * | 8/2015 | Su | H01L 21/02532 |
| 2005/0158935 | A1 * | 7/2005 | Shin | H01L 21/28114 438/197 |
| 2007/0122986 | A1 * | 5/2007 | Sandhu | B82Y 10/00 438/301 |
| 2011/0001179 | A1 * | 1/2011 | Yanagi | G11C 16/0408 257/316 |
| 2014/0206170 | A1 * | 7/2014 | Lee | H01L 21/26586 438/302 |
| 2015/0069466 | A1 * | 3/2015 | Chang | H01L 21/30608 257/192 |

* cited by examiner

*Primary Examiner* — Thao P Le
(74) *Attorney, Agent, or Firm* — McDermott Will & Emery LLP

(57) ABSTRACT

An MOS device with increased drain-source voltage (Vds) includes a source region and a drain region deposited on a substrate. A gate region includes an inner spacer that extends the drain region. The inner spacer is formed attached to an isolation spacer that isolates the drain region from the gate region. The inner spacer is configured to extend the drain region to modify an electric field in a portion of a conductive band of the MOS device.

20 Claims, 7 Drawing Sheets

EXTENDED-DRAIN TRANSISTOR USING INNER SPACER

CROSS-REFERENCE TO RELATED APPLICATIONS

This application claims the benefit of priority under 35 U.S.C. §119 from U.S. Provisional Patent Application 62/098,293 filed Dec. 30, 2014, which is incorporated herein by reference in its entirety.

TECHNICAL FIELD

The present description relates generally to integrated circuits, and more particularly, but not exclusively, to a precisely controlled extended-drain transistor using inner spacer.

BACKGROUND

MOS transistors are the building blocks of many electronic devices including communication devices. One of the key operating characteristics of MOS transistors is the breakdown voltage. As the operating voltage applied to an MOS transistor increases, the transistor may eventually breakdown allowing an uncontrollable increase in current to pass through devices of a circuit. Operating above the breakdown voltage for a significant duration reduces the lifetime of the transistor. In CMOS and BiCMOS processes, for instance, the device breakdown voltage is limited by drain-to-channel junction breakdown voltage and can be improved by moving drain away from the channel. In LDMOS devices, shallow trench isolation (STI) may be employed to extend the drain, and thus to achieve a higher operating drain source voltage (Vds).

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

In some aspects of the subject disclosure, methods and implementations for providing high-Vds MOS transistors are described. The subject technology achieves the high Vds for the MOS transistor by extending the drain region of the MOS transistor. The extension of the drain region is accomplished by addition of an inner spacer in the gate region of the MOS device, which can be implemented with high process controllability, thus allowing precisely-controlled power devices. Advantageous features of the subject technology include allowing implementation of higher density extended-drain MOS devices in small technology nodes such as 28 nanometer (nm) and beyond (e.g., 20 nm, 14 nm, and 10 nm) without avoiding design rules. The disclosed technology is applicable for both bulk and fully depleted silicon on insulator (FDSOI) devices that can be used in power applications such as power management circuits.

Figure 1A:
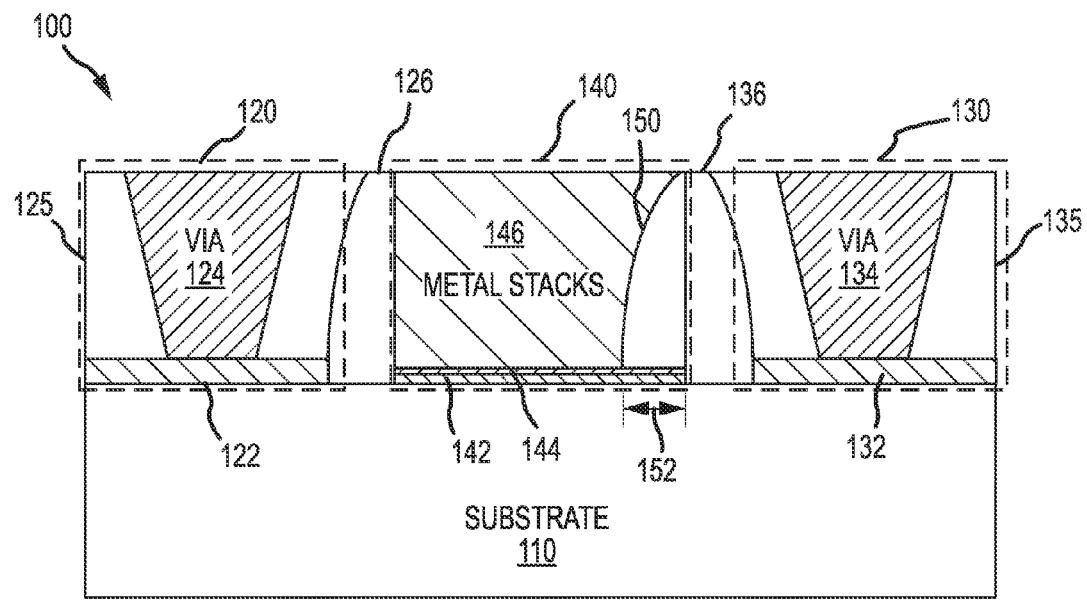
FIGS. 1A-1B illustrate a cross-sectional view of an example structure of an MOS device with increased drain-source voltage (Vds) and conductive band diagrams in accordance with one or more implementations.
Figure 1B:
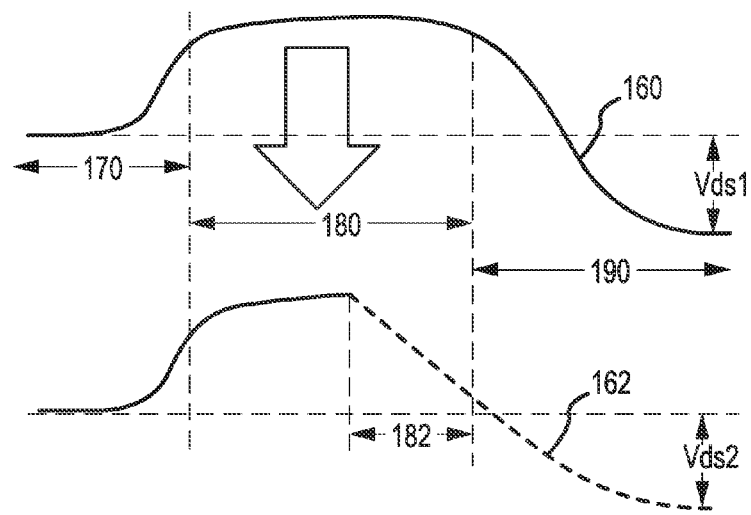
Figure 2A:
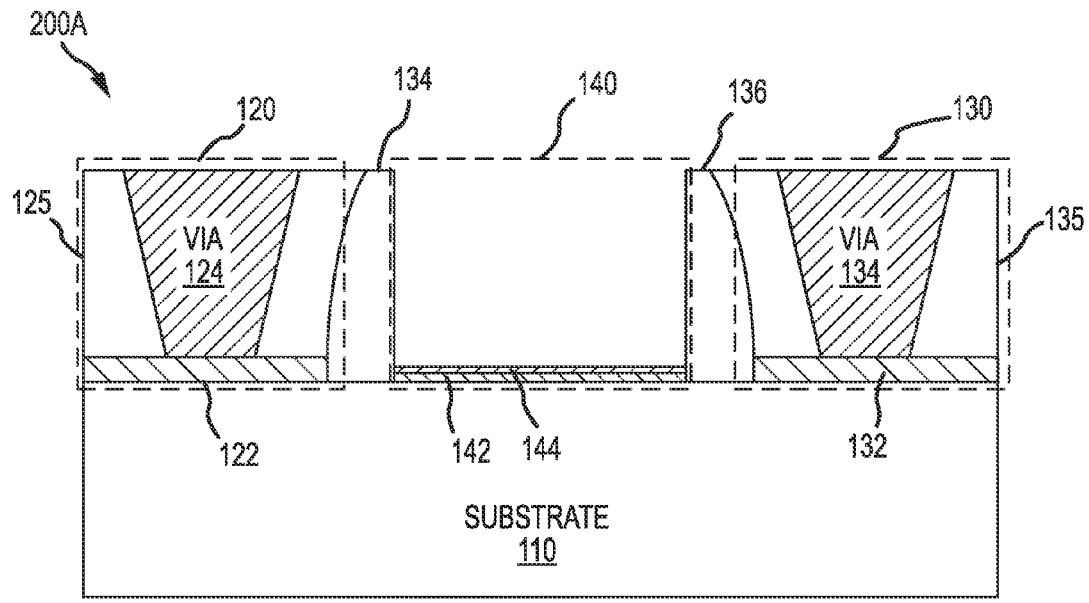
FIGS. 2A through 2D illustrate key process steps for forming the MOS device of FIG. 1A using a partial-gate-last process in accordance with one or more implementations.
Figure 2B:
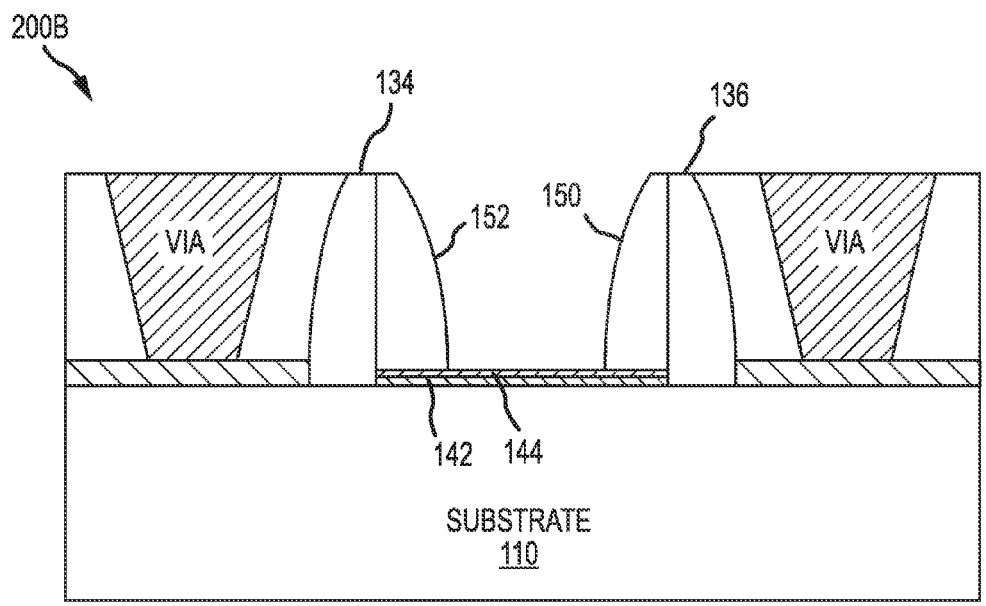
Figure 2C:
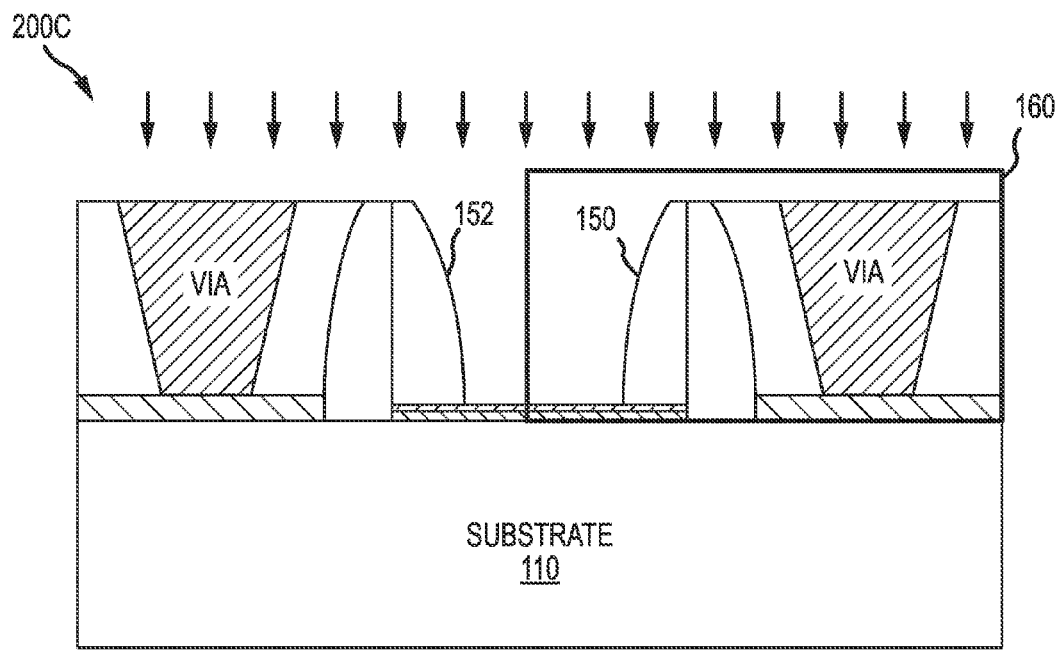
Figure 2D:
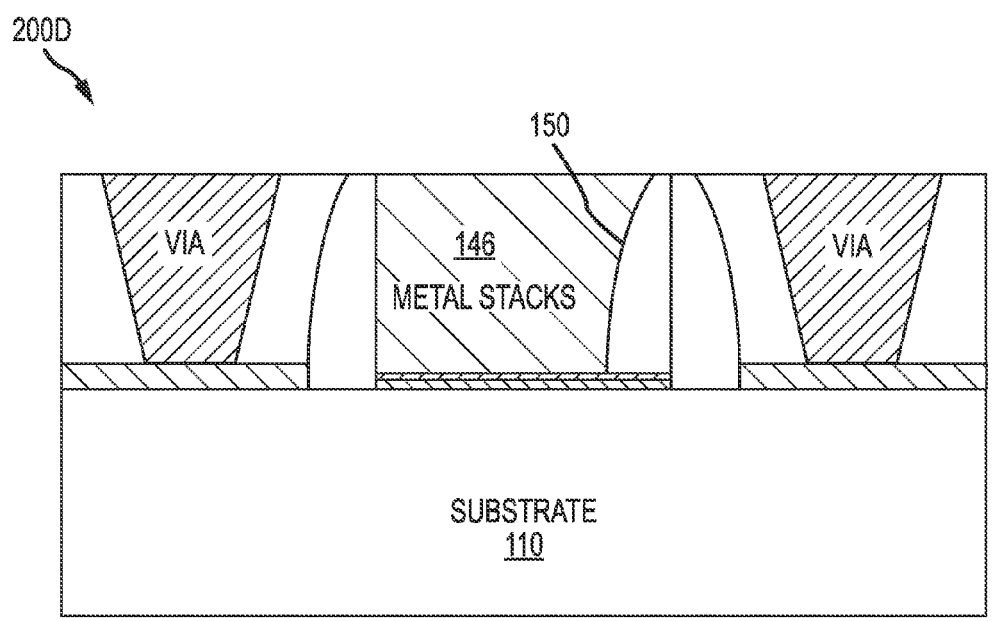
Figure 3A:
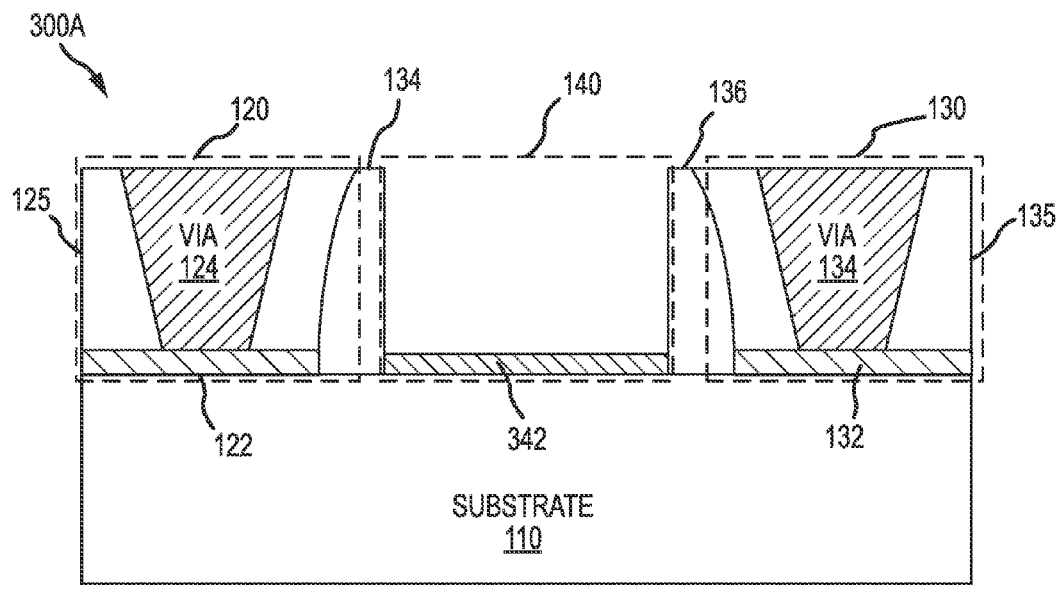
FIGS. 3A through 3D illustrate key process steps for forming the MOS device of FIG. 1A using a full-gate-last process in accordance with one or more implementations.
Figure 3B:
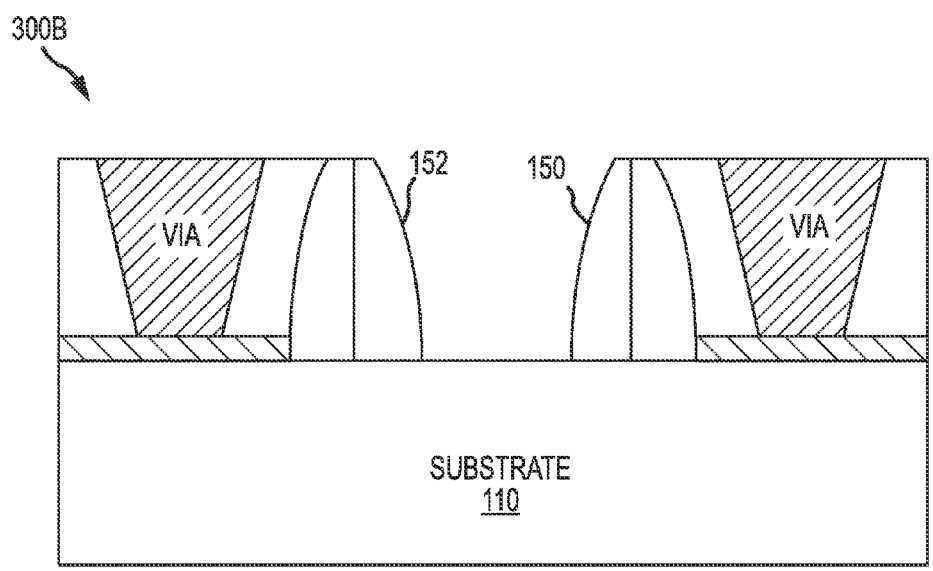
Figure 3C:
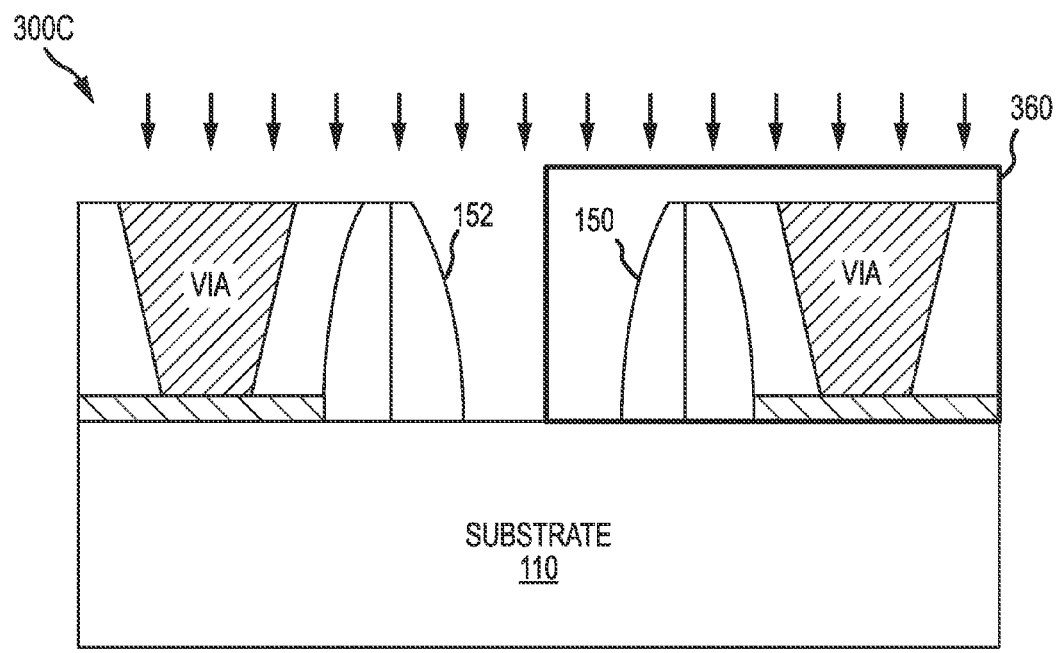
Figure 3D:
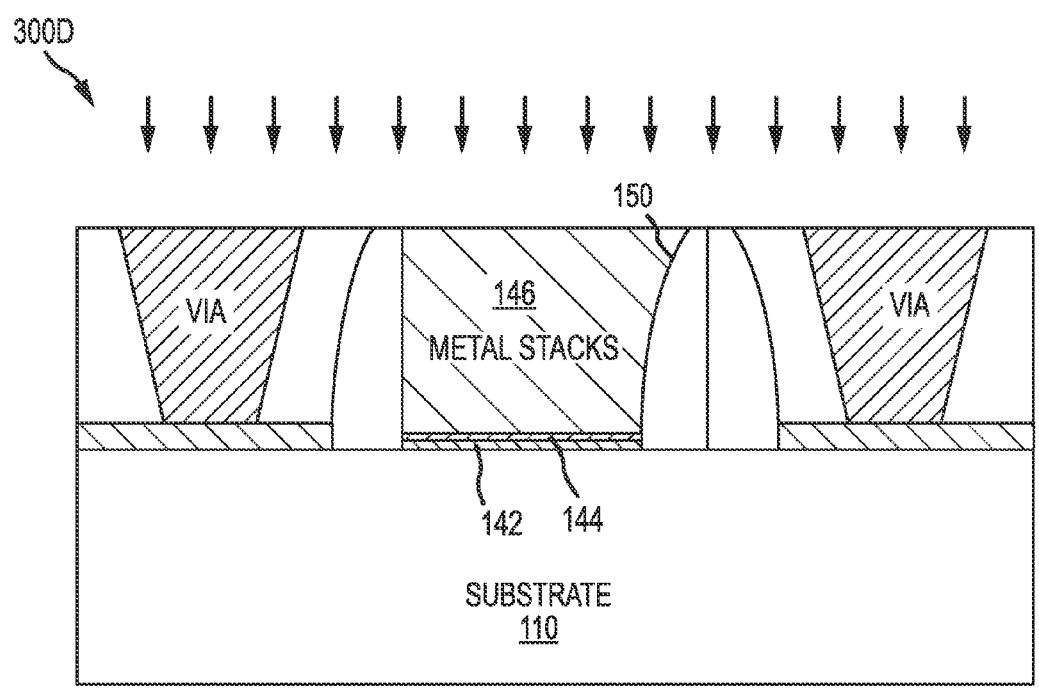

FIGS. 1A-1B illustrate a cross-sectional view of an example structure of an MOS device 100 with increased drain-source voltage (Vds) and conductive band diagrams 160 and 162 in accordance with one or more implementations of the subject technology. The MOS device 100 includes a source region 120, a gate region 140, and a drain region 130 formed on a substrate (e.g., silicon) 110. The gate region 140 is isolated from the drain region 130 and the source region 120, by isolation spacers 136 and 126, respectively. The gate region 140 includes an inner spacer 150 attached to the isolation spacer 136. The inner spacer 150 is a feature of the subject technology that enables the increased Vds voltage of the MOS device 100, as discussed in more detail herein.

In one or more implementations, the source region 120 includes an epitaxial source 122, an oxide (e.g., silicon oxide) portions 125 embracing a via 124, which provides an electrical contact to the epitaxial source 122. The epitaxial source 122 is an n- or p-type (based on the type of the MOS) epitaxially grown layer (e.g., silicon), and the via 124 is formed of a conductive material (e.g., a metal, such as aluminum, copper, tungsten, etc.). The drain region 130 includes the epitaxial drain 132, the oxide portions 135 that embraces a via 134. The via 134 provides an electrical contact to the epitaxial drain 132. The epitaxial drain 132 is an n- or p-type (based on the type of the MOS) epitaxially grown layer (e.g., silicon), and the via 134 is similar to via 124.

The gate region 140 is the region of interest in this disclosure, as the inner spacer 150 is formed of this region, as explained in more detail below. The gate region 140 includes a dielectric layer 142 (e.g., thin or thick oxide such as silicon oxide) and a protection layer 144 (e.g., a high-K layer), on which the inner spacer 150 with a width 152 and a metal stack 146 is formed. In some implementations, the inner oxide 150 may include silicon nitride (SiN), silicon carbide (SiC), silicon oxide (SiO2), or other suitable materials. In some aspects, the high-K layer 144 may include hafnium oxide (HfO) or other suitable materials.

FIG. 1B shows conductive band diagrams 160 and 162 corresponding to a conventional MOS and the MOS device 100. The conductive band diagrams show variation of electric potential (e.g., voltage) versus distance across the length of the MOS device. The width of the source, gate, and drain regions are indicated by arrows 170, 180, and 190, respectively. The conductive band diagrams 160 increase as it passes through a first depletion region between the source and gate regions, is relatively constant in the gate region, and drops in a second depletion region between the gate and drain regions to a value in the drain region that is below its value in the source region (see Vds1). The behavior of the conductive band diagrams 162 of the MOS device 100 differs from the conductive band diagrams 160 in the extended drain (e.g., with a length 182 corresponding to the width 152 of the inner spacer 150) and the drain region. The difference is due to the inner spacer 150 introduced in the gate region 140 of FIG. 1A. The inner spacer 150 causes the electrical potential in the extended drain region 182 to drop at a slower rate, thereby creating a lower electric field strength in that region. The lower electrical field strength in the extended drain region translates into a higher breakdown voltage, which in turn allows a higher Vds to be applied to the MOS device 100. Stated differently, for the same electric field strength, the MOS device 100 can tolerate a larger maximum Vds (see Vds2) than a conventional MOS device (e.g., without the inner spacer 150).

In some implementations, the width 152 of the inner spacer 150 can be as high as 20% of a channel length of the MOS device 100 and depends on an employed technology node. The length of the drain extension (e.g., 182) is based on the width of the inner spacer 150. As a result of reducing the electric filed strength in the extended drain region, the inner spacer can reduce hot carrier injection (HCI) and gate-induced drain leakage (GIDL), which are controlled by the electric filed strength. It is important to note that the addition of the inner spacer 150 in the gate region 140 does not affect MOS device density and is compatible with design rules. As described herein, for partial-gate-last processes used for the 28 nanometer (nm) technology node, the inner spacer 150 is formed over the protection layer 144 covering the dielectric layer 142 formed on the substrate 100 in the gate region. For full-gate-last processes, applicable to 28 nm and smaller technology nodes (e.g., 20 nm, 14 nm, 10 nm, etc.), the inner spacer 150 can be formed over the substrate in the gate region 140, as described herein.

FIGS. 2A through 2D illustrate key process steps for forming the MOS device 100 of FIG. 1A using a partial-gate-last process in accordance with one or more implementations of the subject technology. Not all of the process steps for forming the MOS device 100 are described herein, as the process steps for forming portions of the MOS device 100 shown in the cross-sectional view 200A (hereinafter "core device 200A") are similar to conventional MOS devices. For example, the description of the process steps for forming the gate region 120 and drain region 130 (including epitaxial source and drain 122 and 132, oxide portions 125 and 135, vias 124 and 134), the isolation spacers 134 and 136, the dielectric layer 142, and the protection layer 144 are skipped here for brevity. The process steps described herein are the key process steps for formation of the inner spacer 150 of FIG. 1A using the core device 200A.

The cross-sectional view 200B shows the formation of the inner spacers 150 and 152 on the core device 200A. The first key step is formation (e.g., deposition) of a layer of an inner spacer material (e.g., SiO2, SiN, or SiC) over the protection layer 144. Next, a vertical dry etch (e.g., an isotropic etch such as a reactive ion etch) process is employed to remove the middle portion of the layer deposited in the first step. The dry etch removes the inner spacer material from all horizontal surfaces and leaves the inner spacers 150 and 152, as shown in cross-sectional view 200B, attached to the isolation spacers 134 and 136. The dry etch, however, does not affect the dielectric layer 142 that is protected by the protection layer 144.

In the third step, shown by the cross-sectional view 200C, a lithography process is used to remove the unwanted inner spacer 152. The lithography process includes, for example, masking the wanted portion by a layer 160 and using an isotropic process (e.g., wet etch) to remove the unwanted inner spacer 152. In the final step, as shown by the cross-sectional view 200D, the metal stack 146 is formed in the gate region. The metal stack includes a number of metal layers including a work-function material such as titanium nitride (TiN), tungsten (W), aluminum (Al), or other materials. The partial-gate-last process steps described above can be used for technology nodes of 28 nm and higher. The process steps for formation of the MOS device of the subject technology are not restricted to the process steps described above with respect to FIGS. 2B through 2D, and other process steps may be used to achieve the objective of forming the inner spacer 152 in the gate region 140 of the MOS device 100.

FIGS. 3A through 3D illustrate key process steps for forming the MOS device of FIG. 1A using a full-gate-last process in accordance with one or more implementations of the subject technology. Not all of the process steps for forming the MOS device 100 according to the full-gate-last process step are described herein, as the process steps for forming portions of the MOS device 100 shown in the cross-sectional view 300A (hereinafter "core device 300A") are similar to conventional MOS devices. For example, the description of the process steps for forming the gate region 120 and drain region 130 (including epitaxial source and drain 122 and 132, oxide portions 125 and 135, vias 124 and 134), the isolation spacers 134 and 136, and the dummy thick oxide layer 342 are skipped here for brevity. The process steps described herein are the key process steps for formation of the inner spacer 150 of FIG. 1A using the core device 300A and the full-gate-last process.

The cross-sectional view 300B shows the formation of the inner spacers 150 and 152 on the core device 300A. The first key step is formation (e.g., deposition) of a layer of an inner spacer material (e.g., SiO2, SiN, or SiC) over the dummy thick oxide layer 342. Next, a vertical dry etch (e.g., an isotropic etch such as a reactive ion etch) process is employed to remove the middle portion of the layer deposited in the first step. The dry etch removes the inner spacer material and the dummy thick oxide layer from all horizontal surfaces and leaves the inner spacers 150 and 152, as shown in cross-sectional view 300B, attached to the isolation spacers 134 and 136. After the dry etch the substrate 110 is exposed as the dummy thick oxide layer is also removed by the dry etch.

In the third step, shown by the cross-sectional view 300C, a lithography process is used to remove the unwanted inner spacer 152. The lithography process includes, for example, masking the wanted portion by a layer 360 and using an isotropic process (e.g., wet etch) to remove the unwanted inner spacer 152. In the final step, as shown by the cross-sectional view 300D, the dielectric layer 142, protection layer 144, and metal stack 146 are formed in the gate region over the substrate 110. The full-gate-last process steps described above can be used for technology nodes of 28 nm and beyond (e.g., 20 nm, 14 nm, 10 nm, etc.) and for both planar and FinFET technologies. The process steps for formation the MOS device of the subject technology are not restricted to the process steps described above with respect to FIGS. 3B through 3D, and other process steps may be used to achieve the objective of forming the inner spacer 152 in the gate region 140 of the MOS device 100.

Figure 4:
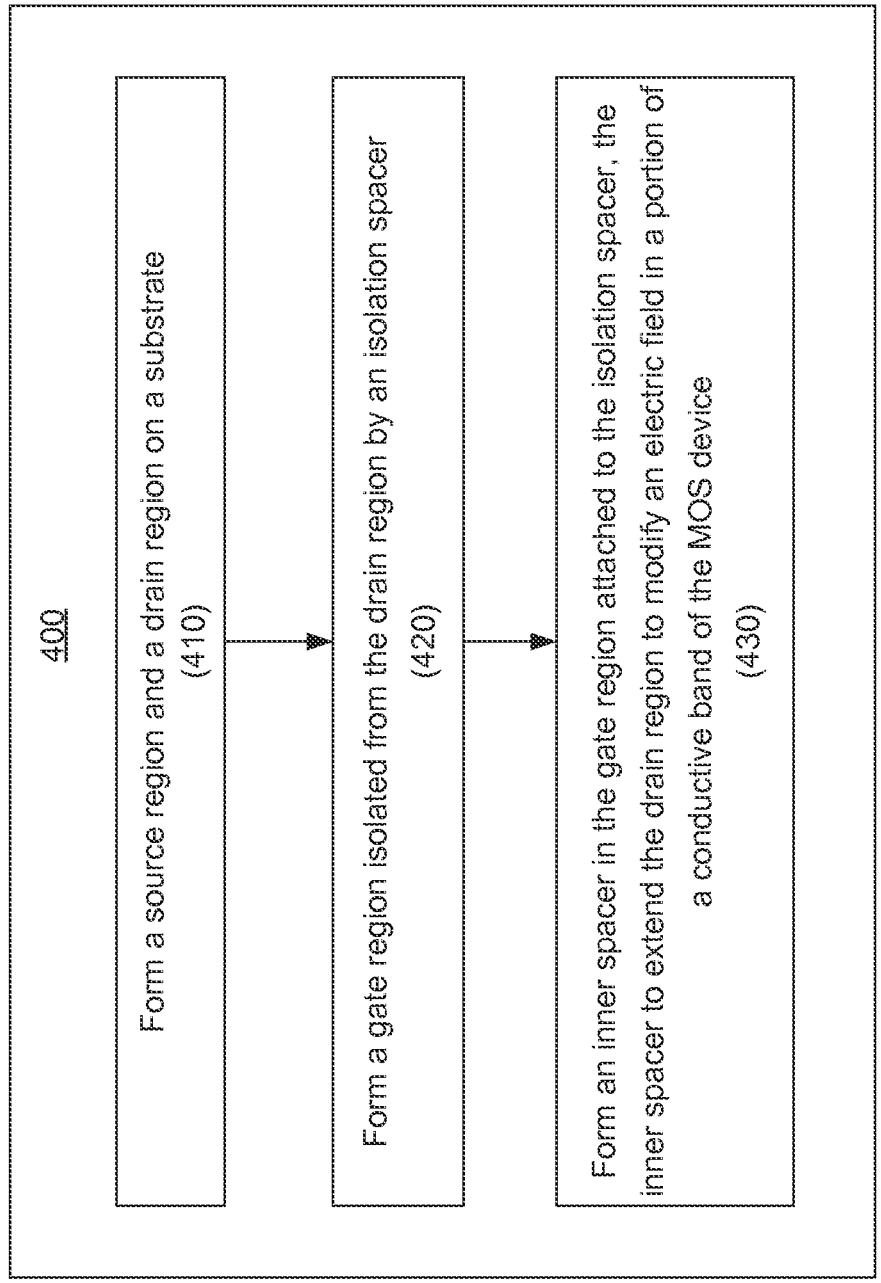
FIG. 4 illustrates an example of a method for providing an MOS device with increased Vds in accordance with one or more implementations.

FIG. 4 illustrates an example of a method 400 for providing an MOS device with increased Vds in accordance with one or more implementations of the subject technology. For explanatory purposes, the blocks of the example method 400 are described herein as occurring in serial, or linearly. However, multiple blocks of the example method 400 can occur in parallel. In addition, the blocks of the example method 400 need not be performed in the order shown and/or one or more of the blocks of the example method 400 need not be performed.

According to the method 400, a source region (e.g., 120 of FIG. 1A) and a drain region (e.g., 130 of FIG. 1A) are formed on a substrate (e.g., 110 of FIG. 1A) (410). A gate region (e.g., 140 of FIG. 1A) isolated from the drain region by an isolation spacer (e.g., 136 of FIG. 1A) is formed (420). An inner spacer (e.g., 150 of FIG. 1A) is formed in the gate region attached to the isolation spacer, the inner spacer extends the drain region (e.g., see 182 of FIG. 1B) to modify an electric field in a portion of a conductive band (e.g., 162 of FIG. 1B) of the MOS device (430).

Figure 5:
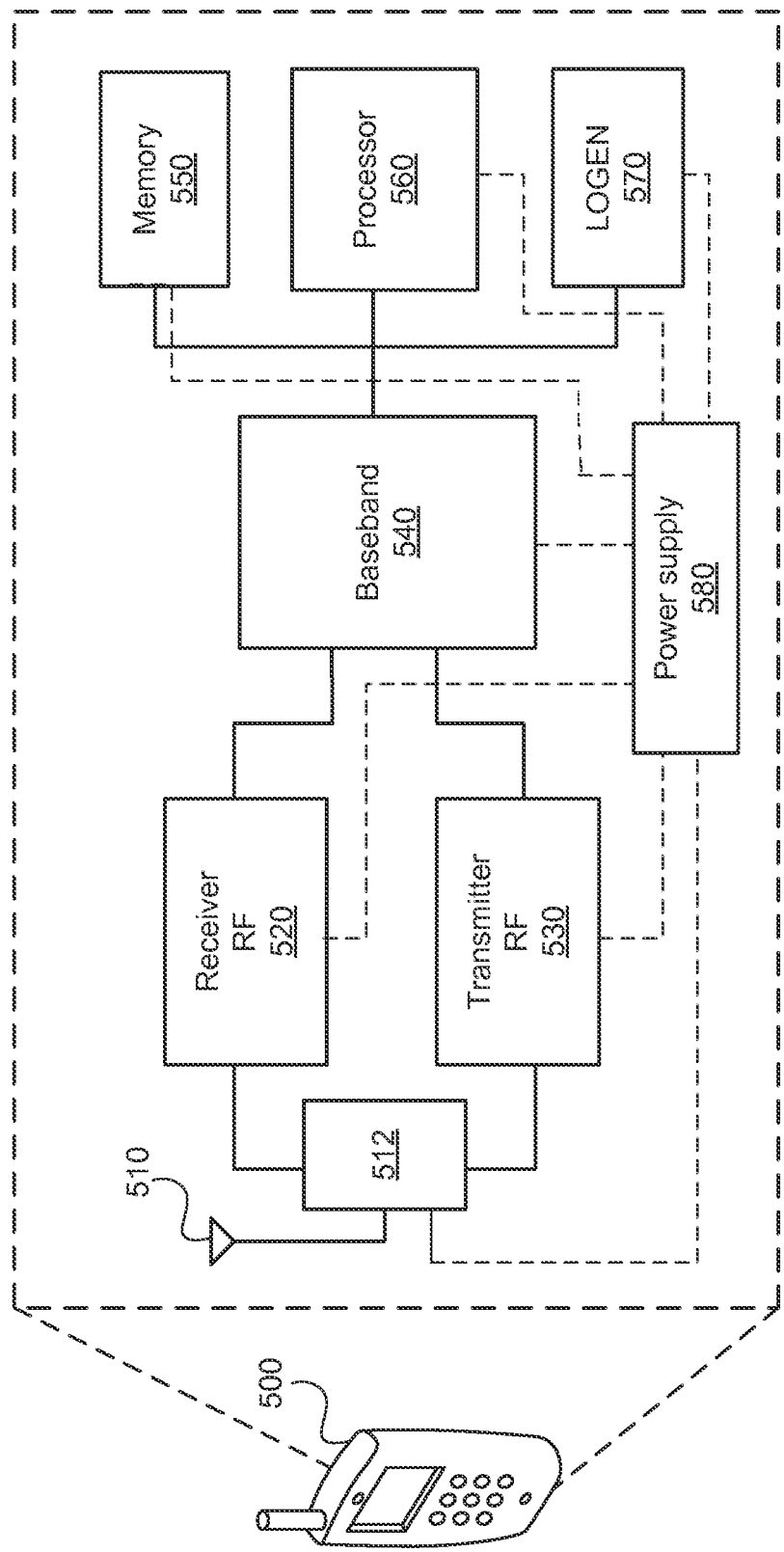
FIG. 5 illustrates an example of a wireless communication device employing features of the subject technology in accordance with one or more implementations.

FIG. 5 illustrates an example of a wireless communication device 500 employing features of the subject technology in accordance with one or more implementations of the subject technology. The wireless communication device 500 includes a radio-frequency (RF) antenna 510, a receiver 520, a transmitter 530, a baseband processing module 540, a memory 550, a processor 460, a local oscillator generator (LOGEN) 570, a power supply 580 and a sensor module 590. In various embodiments of the subject technology, one or more of the blocks represented in FIG. 5 can be integrated on one or more semiconductor substrates. For example, the blocks 520-570 can be realized in a single chip or a single system on chip, or can be realized in a multi-chip chipset.

The RF antenna 510 can be suitable for transmitting and/or receiving RF signals (e.g., wireless signals) over a wide range of frequencies. Although a single RF antenna 510 is illustrated, the subject technology is not so limited.

The receiver 520 comprises suitable logic circuitry and/or code that can be operable to receive and process signals from the RF antenna 510. The receiver 520 may, for example, be operable to amplify and/or down-convert received wireless signals. In various embodiments of the subject technology, the receiver 520 is operable to cancel noise in received signals and can be linear over a wide range of frequencies. In this manner, the receiver 520 is suitable for receiving signals in accordance with a variety of wireless standards. Wi-Fi, WiMAX, Bluetooth, and various cellular standards.

The transmitter 530 comprises suitable logic circuitry and/ or code that can be operable to process and transmit signals from the RF antenna 510. The transmitter 530 may, for example, be operable to up-convert baseband signals to RF signals and amplify RF signals. In various embodiments of the subject technology, the transmitter 530 is operable to up-convert and to amplify baseband signals processed in accordance with a variety of wireless standards. Examples of such standards include Wi-Fi, WiMAX, Bluetooth, and various cellular standards. In various embodiments of the subject technology, the transmitter 530 is operable to provide signals for further amplification by one or more power amplifiers.

The duplexer 512 provides isolation in the transmit band to avoid saturation of the receiver 520 or damaging parts of the receiver 520, and to relax one or more design requirements of the receiver 520. Furthermore, the duplexer 512 can attenuate the noise in the receive band. The duplexer is operable in multiple frequency bands of various wireless standards.

The baseband processing module 540 comprises suitable logic, circuitry, interfaces, and/or code that can be operable to perform processing of baseband signals. The baseband processing module 540 may, for example, analyze received signals and generate control and/or feedback signals for configuring various components of the wireless communication device 500 such as the receiver 520. The baseband processing module 540 is operable to encode, decode, transcode, modulate, demodulate, encrypt, decrypt, scramble, descramble, and/or otherwise process data in accordance with one or more wireless standards.

The processor 560 comprises suitable logic, circuitry, and/ or code that can enable processing data and/or controlling operations of the wireless communication device 500. In this regard, the processor 560 is enabled to provide control signals to various other portions of the wireless communication device 500. The processor 560 can also control transfers of data between various portions of the wireless communication device 500. Additionally, the processor 560 can enable implementation of an operating system or otherwise execute code to manage operations of the wireless communication device 500.

The memory 550 comprises suitable logic, circuitry, and/or code that can enable storage of various types of information such as received data, generated data, code, and/or configuration information. The memory 550 includes, for example, RAM, ROM, flash, and/or magnetic storage. In various embodiment of the subject technology, the memory 550 may include a RAM, DRAM, SRAM, T-RAM, Z-RAM, TTRAM, or any other storage media.

The local oscillator generator (LOGEN) 570 comprises suitable logic, circuitry, interfaces, and/or code that can be operable to generate one or more oscillating signals of one or more frequencies. The LOGEN 570 can be operable to generate digital and/or analog signals. In this manner, the LOGEN 570 can be operable to generate one or more clock signals and/or sinusoidal signals. Characteristics of the oscillating signals such as the frequency and duty cycle can be determined based on one or more control signals from, for example, the processor 560 and/or the baseband processing module 540.

In operation, the processor 560 can configure the various components of the wireless communication device 500 based on a wireless standard according to which it is desired to receive signals. Wireless signals can be received via the RF antenna 510 and amplified and down-converted by the receiver 520. The baseband processing module 540 can perform noise estimation and/or noise cancellation, decoding, and/or demodulation of the baseband signals. In this manner, information in the received signal can be recovered and utilized appropriately. For example, the information can be audio and/or video to be presented to a user of the wireless communication device, data to be stored to the memory 550, and/or information affecting and/or enabling operation of the wireless communication device 500. The baseband processing module 540 can modulate, encode and perform other processing on audio, video, and/or control signals to be transmitted by the transmitter 530 in accordance to various wireless standards.

In some implementations of the subject technology, any of the circuits of the wireless communication device 500, for example, varies modules and/or components of the receiver 520, transmitter 530, and/or power supply 580 can be implemented using the MOS transistors (e.g., 100 of FIG. 1A) of the subject technology. By using the MOS transistor structures of the subject technology, the wireless communication device 500 can benefit from the increased Vds of the MOS transistors, especially in power circuitries.

Those of skill in the art would appreciate that the various illustrative blocks, modules, elements, components, and methods described herein can be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans can implement the described functionality in varying ways for each particular application. Various components and blocks can be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect can apply to all configurations, or one or more configurations. An aspect can provide one or more examples of the disclosure. A phrase such as an "aspect" refers to one or more aspects and vice versa. A phrase such as an "embodiment" does not imply that such embodiment is essential to the subject technology or that such embodiment applies to all configurations of the subject technology. A disclosure relating to an embodiment can apply to all embodiments, or one or more embodiments. An embodiment can provide one or more examples of the disclosure. A phrase such an "embodiment" can refer to one or more embodiments and vice versa. A phrase such as a "configuration" does not imply that such configuration is essential to the subject technology or that such configuration applies to all configurations of the subject technology. A disclosure relating to a configuration can apply to all configurations, or one or more configurations. A configuration can provide one or more examples of the disclosure. A phrase such as a "configuration" can refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein can be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. An MOS device with increased drain-source voltage (Vds), the MOS device comprising:
    a source region and a drain region deposited on a substrate; and
    a gate region comprising an inner spacer configured to extend the drain region,
    wherein:
    the inner spacer is formed attached to an isolation spacer that isolates the drain region from the gate region, and
    the inner spacer is configured to extend the drain region to modify an electric field in a portion of a conductive band of the MOS device.

2. The MOS device of claim 1, wherein the inner spacer comprises at least one of silicon nitride, silicon carbide, or an oxide inner spacer, wherein the oxide inner spacer comprises silicon oxide.

3. The MOS device of claim 1, wherein a width of the inner spacer depends on an employed technology node, wherein the width of the inner spacer comprises approximately 20 percent of an MOS channel length.

4. The MOS device of claim 1, wherein a length of a drain extension achieved by forming the inner spacer is based on a width of the inner spacer.

5. The MOS device of claim 1, wherein the inner spacer is configured to increase the Vds of the MOS device by extending the drain region, wherein the inner spacer is configured to extend the drain region to reduce the electric field in the portion of the conductive band of the MOS device.

6. The MOS device of claim 1, wherein the inner spacer is configured to reduce hot carrier injection (HCI) and gate-induced drain leakage (GIDL).

7. The MOS device of claim 1, wherein addition of the inner spacer in the gate region does not affect an MOS device density and is compatible with design rules.

8. The MOS device of claim 1, wherein for partial-gate-last processes the inner spacer is formed over a protection layer covering a dielectric layer formed on the substrate in the gate region, wherein the partial-gate-last processes include a 28 nanometer (nm) technology node.

9. The MOS device of claim 1, wherein for full-gate-last processes the inner spacer is formed over the substrate in the gate region, wherein the full-gate-last processes include 20 nm and smaller technology nodes.

10. A method for providing an MOS device with increased drain-source voltage (Vds), the method comprising:
    forming a source region and a drain region on a substrate;
    forming a gate region isolated from the drain region by an isolation spacer; and
    forming an inner spacer in the gate region attached to the isolation spacer, wherein:
the inner spacer is configured to extend the drain region to modify an electric field in a portion of a conductive band of the MOS device.

11. The method of claim 10, wherein forming the inner spacer comprises forming an oxide inner spacer, wherein forming the oxide inner spacer comprises using silicon oxide, and wherein forming the inner spacer comprises using one of silicon nitride or silicon carbide.

12. The method of claim 10, further comprising determining a width of the inner spacer based on an employed technology node, wherein the width of the inner spacer comprises approximately 20 percent of an MOS channel length.

13. The method of claim 10, wherein forming the inner spacer results in an extension of a drain length, and wherein a drain-length extension is based on a width of the inner spacer.

14. The method of claim 10, further comprising:
configuring the inner spacer to increase the Vds of the MOS device by extending the drain region; and
configuring the inner spacer to reduce the electric field in the portion of the conductive band of the MOS device by extending the drain region.

15. The method of claim 10, further comprising configuring the inner spacer to reduce hot carrier injection (HCI) and gate-induced drain leakage (GIDL).

16. The method of claim 10, wherein forming the inner spacer in the gate region does not affect an MOS device density and is compatible with design rules.

17. The method of claim 10, further comprising, for partial-gate-last processes, forming the inner spacer over a protection layer covering a dielectric layer formed on the substrate in the gate region, wherein the partial-gate-last processes include a 28 nanometer (nm) technology node.

18. The method of claim 10, further comprising, for full-gate-last processes, forming the inner spacer over the substrate in the gate region, wherein the full-gate-last processes include 20 nm and smaller technology nodes.

19. A communication device, comprising:
a radio-frequency (RF) circuitry configured to communicate RF signals;
one or more processors; and
memory coupled to the one or more processors,
wherein at least one of the RF circuitry, one or more processors, or the memory comprises an MOS device with increased drain-source voltage (Vds), the MOS device comprising:
a source region and a drain region deposited on a substrate;
a gate region isolated from the drain region by an isolation spacer; and
an inner spacer formed in the gate region and attached to the isolation spacer,
wherein:
the inner spacer is configured to extend the drain region to modify an electric field in a portion of a conductive band of the MOS device.

20. The communication device of claim 19, wherein:
the inner spacer comprises at least one of silicon nitride, silicon carbide, or an oxide inner spacer,
the oxide inner spacer comprises silicon oxide,
a width of the inner spacer depends on an employed technology node,
the width of the inner spacer comprises approximately 20 percent of an MOS channel length,
a length of a drain extension achieved by forming the inner spacer is based on a width of the inner spacer,
the inner spacer is configured to increase the Vds of the MOS device by extending the drain region, and
the inner spacer is configured to reduce hot carrier injection (HCI) and gate-induced drain leakage (GIDL).

* * * * *